(12) United States Patent
Höreth et al.

(10) Patent No.: US 7,802,211 B2
(45) Date of Patent: Sep. 21, 2010

(54) METHOD AND DEVICE FOR VERIFYING DIGITAL CIRCUITS

(75) Inventors: Stefan Höreth, Glonn (DE); Martin Müller-Brahms, München (DE); Thomas Rudlof, West Liuu, OR (US)

(73) Assignee: Onespin Solutions GmbH, Munich (DE)

( * ) Notice: Subject to any disclaimer, the term of this patent is extended or adjusted under 35 U.S.C. 154(b) by 632 days.

(21) Appl. No.: 10/525,999

(22) PCT Filed: Aug. 19, 2003

(86) PCT No.: PCT/EP03/09179

§ 371 (c)(1),
(2), (4) Date: Nov. 28, 2005

(87) PCT Pub. No.: WO2004/025520

PCT Pub. Date: Mar. 25, 2004

(65) Prior Publication Data

US 2006/0101359 A1    May 11, 2006

(30) Foreign Application Priority Data

Aug. 29, 2002   (DE) ............................ 102 39 782

(51) Int. Cl.
*G06F 17/50* (2006.01)
(52) U.S. Cl. .......................................... 716/5; 716/1
(58) Field of Classification Search ............. 716/4–5, 716/1, 11
See application file for complete search history.

(56) References Cited

U.S. PATENT DOCUMENTS

| | | | |
|---|---|---|---|
| 5,493,508 A * | 2/1996 | Dangelo et al. | 716/5 |
| 5,754,454 A * | 5/1998 | Pixley et al. | 702/123 |
| 5,910,897 A * | 6/1999 | Dangelo et al. | 716/19 |
| 6,026,222 A | 2/2000 | Gupta et al. | |
| 6,148,436 A * | 11/2000 | Wohl | 716/18 |
| 6,247,165 B1 * | 6/2001 | Wohl et al. | 716/5 |

(Continued)

FOREIGN PATENT DOCUMENTS

JP        05-233744        10/1993

(Continued)

OTHER PUBLICATIONS

International Preliminary Examination Report from corresponding PCT application No. PCT/EP03/09179.

(Continued)

*Primary Examiner*—Jack Chiang
*Assistant Examiner*—Suchin Parihar
(74) *Attorney, Agent, or Firm*—Brinks Hofer Gilson & Lione

(57) ABSTRACT

For the verification of digital circuits, which can have multiplier structures in particular, an equivalence test between the digital circuit and a reference description of this digital circuit is proposed, in such a way that firstly for the multiplier structures implemented in the digital circuit the realized implementation alternative of several pre-defined different implementation alternatives is determined in each case and inserted into the reference description in place of the respective multiplication function, in order subsequently to execute the equivalence test with the reference description changed thereby. In this way, the structural equivalence between the reference description and the digital circuit to be verified can be substantially increased, which speeds up the verification process overall.

13 Claims, 1 Drawing Sheet

U.S. PATENT DOCUMENTS

Figure 1:
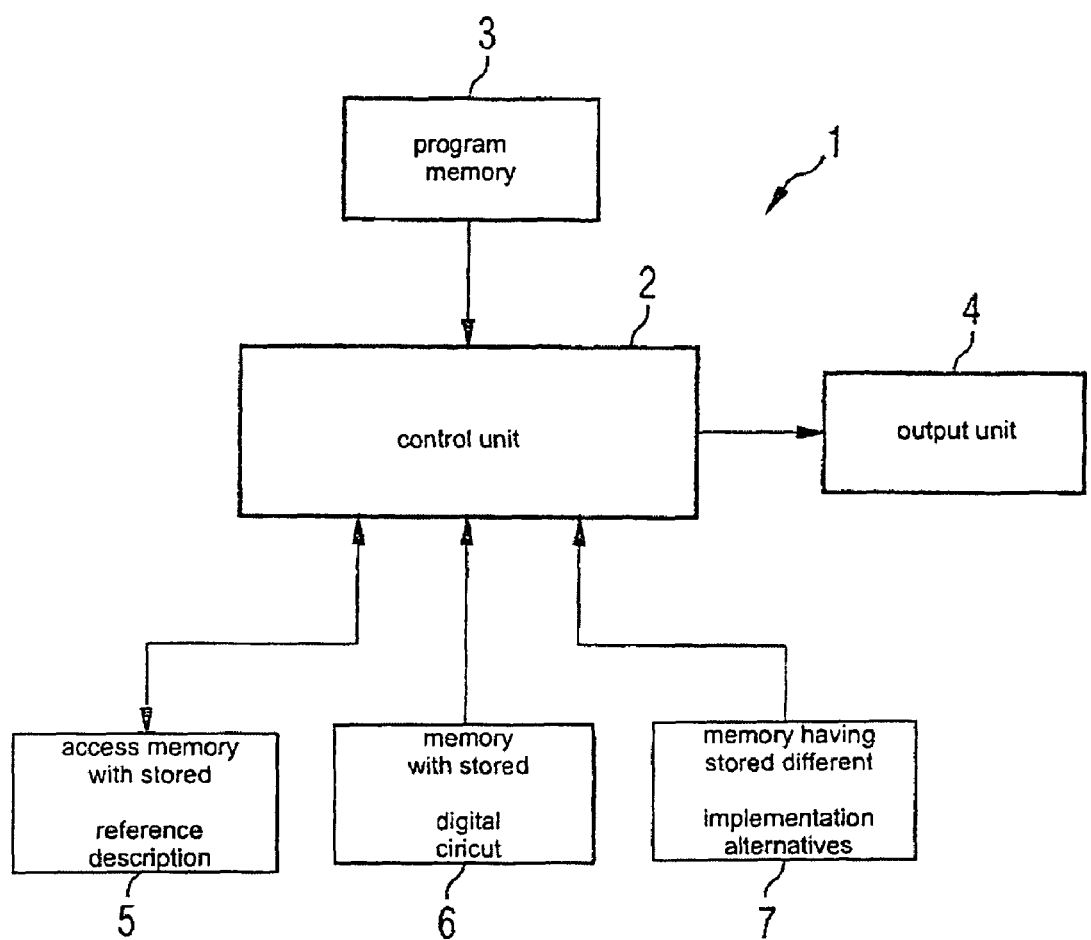

| | | | |
|---|---|---|---|
| 6,301,687 B1* | 10/2001 | Jain et al. | 716/3 |
| 6,321,173 B1* | 11/2001 | Foster | 702/109 |
| 6,484,292 B1* | 11/2002 | Jain et al. | 716/2 |
| 6,848,084 B1* | 1/2005 | Pandey et al. | 716/1 |
| 6,993,730 B1* | 1/2006 | Higgins et al. | 716/3 |
| 7,082,586 B2* | 7/2006 | Horeth et al. | 716/5 |
| 7,137,084 B1* | 11/2006 | Chen et al. | 716/4 |
| 2003/0076723 A1* | 4/2003 | Zarrineh et al. | 365/201 |
| 2003/0105785 A1* | 6/2003 | Kunz et al. | 708/200 |
| 2003/0115562 A1* | 6/2003 | Martin et al. | 716/5 |
| 2005/0149311 A1* | 7/2005 | McGaughy | 703/14 |
| 2006/0101359 A1* | 5/2006 | Horeth et al. | 716/5 |

FOREIGN PATENT DOCUMENTS

| | | |
|---|---|---|
| JP | 06-162133 | 10/1994 |
| JP | 10-063707 | 6/1998 |
| JP | 2000-242672 | 8/2000 |
| JP | 2001-092869 | 6/2001 |
| WO | WO 2004/025520 A3 | 8/2003 |

OTHER PUBLICATIONS

Dominick Stoffel and Wolfgan Kunz, *Verification of Integer Multipliers on the Arithmetic Bit Level*, pp. 183-189, IEEE, 2001.

Ying-Tsai Chang and Kwang-Ting (Tim) Cheng, *Introduction-Based Gate-Level Verification of Multipliers*, pp. 190-193, IEEE, 2001.

Jiunn-Chern Chen and Yirng-An Chen, *Equivalence Checking of Integer Multipliers*, IEEE, 2001.

Chien-Chung Tsai and Malgorzata Marek-Sadowska, *Boolean Matching Using Generalized Reed-Muller Forms*, published prior to the filing of this application.

Chien-Chung Tsai and Malgorzata Marek-Sadowska, *Boolean Matching Using Generalized Reed-Muller Forms*, published prior to the filing of this application, 1994.

* cited by examiner

METHOD AND DEVICE FOR VERIFYING DIGITAL CIRCUITS

CROSS REFERENCE TO RELATED APPLICATIONS

This application is the national stage application of international application number PCT/DE2003/09179, filed on Aug. 19, 2003, which claims the benefit of priority to German Patent Application DE 10239782.1, filed on Aug. 29, 2002, incorporated herein by reference.

The present invention relates to a process as well as a correspondingly configured device and a correspondingly configured computer program product for the verification of digital circuits, in particular digital circuits with multiplier structures.

BACKGROUND OF THE INVENTION

As known multiplier structures or multiplication functions are being used extensively in digital circuits, for example for processors, digital signal processors (DSP) or graphic chip sets etc. An error in a chip with a multiplication function can entail—as also errors in other circuit structures—failure of the entire chip.

Therefore maximum importance is attached to the verification of digital circuits, after these have been developed computer-aided by means of a synthesis tool, for example. Recently, in this connection so-called equivalence testing has gained more and more significance. In this case, it is checked to what extent the functions implemented in the digital circuit are equivalent or otherwise with the circuit structures, described by a reference description, for example an RTL—("register transfer level"), VHDL—("very high speed IC HW description language") or Verilog-description with regard to their operating mode. Modern equivalence checkers can process digital circuits with several million gates. In this case, the equivalence checkers deliver very good results particularly, if the circuit designs to be compared with one another, that is to say the digital circuit to be verified and the reference circuit description on which it is based, have a good degree of structural similarity. On the other hand, an equivalence test does not deliver satisfactory results, if the digital circuit to be verified and the reference description on which it is based structurally differ substantially to a greater or lesser degree and therefore only have few internal equivalences.

In this case the formal verification of multiplier structures and/or multiplication functions is considered one of the most difficult problems with regard to the equivalence checking of digital circuits.

It is known that decimal numbers A and B can be multiplied together in various ways. Thus, for example, either the product A×B can be formed or the product B×A. In the known way the product can also be formed by the individual digits of the two decimal numbers being multiplied together and the sum of the sub-products resulting therefrom then being formed. The sequence, in which the sub-products are added up, can vary for each individual case, naturally without another result of multiplying the numbers A and B being obtained. Dependent on what method is selected for multiplying the numbers A and B, in order to implement the corresponding multiplier structure one of different possible implementation alternatives or implementation variants can be employed, whereby although all these different implementation variants deliver the same multiplication result, with regard to their structure possibly they have no or only few internal equivalences. Furthermore, naturally also various architectures can be used for the implementation of multiplier structures.

As an added difficulty it is also a fact that multiplication functions in digital circuits usually do not appear in isolation, but are embedded in environment logic. At the same time in certain circumstances it is to be considered that the limits of the multiplication functions—due to circuit optimizations for example—are only incompletely given ("sea of gates") and therefore under formal criteria the multiplication functions in certain circumstances are no longer (explicitly) present.

Until now no process has been known with which multiplier structures within digital circuits can be reliably and quickly recognized. Due to the functional optimization possibilities of modern synthesis processes when designing digital circuits for example, simple "pattern matching" methods, which simply concern comparison of the circuit structure with a reference circuit structure, are ruled out for example. With regard to the verification of multiplier structures various competing methods are known.

The simplest procedure, which may be designated as generic method, proposes not allowing the multiplier structures contained in a digital circuit to undergo any kind of special treatment, so that before verification of the digital circuit in the form of an equivalence test no explicit recognition of the multiplier structures or multiplication functions contained in the digital circuit is necessary. The disadvantage connected with this procedure however is that the equivalence test frequently needs long run times and possibly may end in failure of the verification. The run time requirement of the equivalence test heavily depends on (random) selection of the implementation alternative for the individual multiplier structures, on which the equivalence test is based.

In accordance with a further method for the verification of multiplier structures before executing the equivalence test for each individual multiplier structure or multiplication function, the physically selected implementation alternative is defined, that is to say specified by the user. The problem connected with this method however is that this knowledge is frequently not (no longer) available at the time of the verification. If wrong data are given by the user before executing the equivalence test and therefore wrong implementation alternatives are used as the basis of the equivalence test, this method has the same disadvantages as the generic verification process mentioned above.

Finally, various verification processes are also known from the prior art, which are limited to individual multiplication functions or multiplier structures seen in isolation, that is to say the implementation of the digital circuit to be verified as well as the reference description to be compared therewith are only constituted by the multiplication itself. Therefore it is known for example from "Induction-based Gate Level Verification of Multipliers", Y. T. Chang and K. T. Cheng, International Conference on Computer Aided Design (ICCAD), page 190 et seq., 2001, using an induction-based method to split up the verification of n-bit multipliers into n sub-equivalence checks. "Equivalence Checking of Integer Multipliers", J.-C. Chen and Y-A. Chen, Asian Pacific Design Automation Conference (ASPDAC), 2001 for example proposes the depiction of n×n array multipliers or n×n Wallace Baum multipliers over so-called "Multiplicative Power Hybrid Decision Diagrams" (*PHDD) in the form of an illustration on data element level in order to test the equivalence of two integral multipliers. In addition, the depiction of integral multipliers on bit level in the form of so-called "Binary Decision Diagrams" (BDD), or on data element level in the form of so-called "Multiplicative Binary Moment Diagrams" (*BMD) is disclosed in this publication. Finally "Verification of Integer Multipliers on the Arithmetic Bit Level", D. Stoffel and W. Kunz, International Conference on Computer-Aided Design (ICCAD), P. 183-189, 2001, for the verification of integral multipliers proposes the use of a Boolean mapping or image algorithm, which extracts a network of half-adders from a gate netlist of an adder circuit, in order subsequently by means of simple arithmetical operations to be able to carry out an equivalence test in the case of known arithmetic depiction on bit level of the adder circuit. The method proposed in this publication is based on the realization, already described above, that integral multiplications can be essentially divided into two sections, that is to say on the one hand formation of sub-products and on the other hand addition of the sub-products for the final multiplication result.

As previously mentioned the verification processes described last are limited to individual, isolated multiplication functions in each case. These verification processes however in practice are ruled out for the verification of digital circuits, that is to say, of synthesis results, since the multiplication functions are usually not present in isolation.

From the prior art therefore no practical processes for the verification of multiplier structures or multiplication functions implemented in digital circuits are known. The efficiency of the verification processes known from the prior art usually heavily depends on the physical implementation of the respective multiplication function. According to the prior art therefore additional information about the type and structure of the multiplier structures in the digital circuit to be verified is indispensable for efficient verification.

SUMMARY OF THE INVENTION

The object of the present invention is therefore to provide an effective process for the verification of digital circuits as well as a correspondingly configured device, with which the problems described above can be eliminated and also complex digital circuits with multiplier structures in particular can be verified through an equivalence test, without information about the implementation alternatives of the multiplier structures realized in the digital circuit being explicitly known or the verification being limited to only a physical implementation alternative of the multiplier structures.

Accordingly, a verification process is provided and a computer program product with a program-code is provided for executing the verification process in accordance with the invention, whenever the program runs on a computer or a computer system and a digital storage medium, for example a disk or CD ROM, with electronically selectable control signals for executing the verification process in accordance with the invention, in cooperation with the computer system.

It is proposed in accordance with the invention for the verification of a digital circuit first to determine or decide which of several pre-defined implementation alternatives of specific circuit structures are used in the implementation of the digital circuit to be verified. For this purpose, the different pre-defined implementation alternatives for the corresponding circuit structures can be simulated within their embedding in the reference description of the digital circuit, which is to be compared in the equivalence test with the implementation of the digital circuit, and can be compared with a simulation of the implementation of the digital circuit. Thus, the different implementation alternatives can be simulated in parallel.

For each specific circuit structure of the digital circuit that implementation alternative, whose simulation has the greatest degree of equivalence with the simulation of the implementation of the digital circuit to be verified is determined in this way.

Subsequently, the implementation alternatives of these circuit structures determined in this way can be inserted into the corresponding reference description as replacement for the description of these circuit structures contained therein, in order to execute the actual equivalence check with the reference description changed in this way, that is to say the changed reference description is then compared with the implementation of the digital circuit to be verified. The implementation alternatives for the specific circuit structures, inserted into the reference description, can finally be verified separately with a special process.

It is therefore proposed in accordance with the invention first to determine and/or decide in the equivalence test and/or in the equivalence comparison of a reference circuit, that contains critical substructures, with an implementation of the circuit which of the known implementation alternatives of the critical substructures are used in the implementation of the digital circuit to be verified and/or which of the known implementation alternatives of the implementation used are structurally most similar. Structural similarity is by definition given, if an implementation alternative—after it has been inserted into the context of the reference description—possesses many internal design points, to which identical internal design points exist in the implementation to be verified. The degree of the structural similarity of the implementation alternatives with the implementation actually used is determined by a simulation-based process, whose complexity only linearly depends on the size of the digital circuit. This can be achieved by a fixed number of randomly produced input assignments of the digital circuit the values being computed at all internal design points of the digital circuit ("random pattern" simulation), which happens both for all known implementation alternatives of critical substructures in the context of the reference description as well as for the entire implementation of the digital circuit.

In place of establishing the absolute equivalence of internal design points of the implementation alternatives of the critical parts structures with internal design points of the implementation of the digital circuit to be verified, advantageously only the equivalence of the design points on all randomly produced input assignments is measured. This statistical process is sufficient for each critical sub-structure to determine the implementation alternative structurally most similar for the implementation.

Generally, substructures of a reference circuit are critical, whenever there are several possible functionally equivalent but structurally greatly different implementation alternatives for these substructures. Multiplier structures are frequently a common example of such critical substructures. For the applicability of the process described above therefore only the possible implementation alternatives of the critical parts structures must be known, while however which implementation alternative was actually used in the implementation of the digital circuit to be verified does not have to be known.

In order to be able to determine efficiently, that is to say with a complexity only linearly dependent on the size of the digital circuit, which internal design points of the implementation alternatives on all simulated patterns match internal design points of the implementation to be verified, a process of equivalence class refinement may be used. All internal design points, whose non-match has not yet been proven, are combined in each case into an equivalence class. After simulation of a randomly produced input assignment of the digital circuit, each equivalence class is split up into sub-classes, whose elements on the simulated input assignment match.

Internal points of observation, which still lie in the same equivalence class after a fixed number of simulation steps are rated as equivalent.

In the case of the specific circuit structures or critical substructures, for which in the way described above those implementation alternatives, whose simulation has the greatest degree of equivalence with the simulation of the digital circuit are determined, this may concern multiplication functions or multiplier structures in particular, which—as described above—cannot be verified or only inadequately with conventional processes. Of course, the present invention however is not limited to the verification and/or recognition of multiplier structures in digital circuits, but it can be used in principle for all kinds of circuit structures, for which different pre-defined implementation alternatives are applicable.

A variety of advantages is linked with the combination described above. Multiplier structures can be recognized purely by observing the reference description and the implementations embedded therein of the multiplier structures. Implementation limits as well as position of the multiplier structures in the synthesized digital circuit, which is to be verified, do not have to be known. In particular such implementation limits in the synthesized digital circuit do not have to exist even explicitly, that is to say these limits may be "interleaved" for example through synthesis optimizations with other circuit parts. In accordance with a preferred embodiment of the present invention, simultaneous recognition of all multiplier structures and/or multiplication functions contained in the synthesized digital circuit is possible. The invention can be realized at low cost and in order to recognize the implementation alternatives for the multiplier structures used in the digital circuit provides a high recognition rate and high recognition reliability. In accordance with the invention, the run time required for implementing the process is only linearly dependent on the size of the digital circuit to be verified. As previously mentioned, the process in accordance with the invention in principle can also be transferred to the recognition of other circuit functions, which deviate from multiplication functions.

The information about the implementation variants of multiplier structures used in the digital circuit to be verified or other specific circuit structures, obtained by means of the present invention, for which a variety of different and/or pre-defined implementation variants comes into question, leads to substantial speeding up in the equivalence testing of digital circuits, whereby only very small additional cost of computation is necessary for the computer and/or computer-aided execution of the equivalence test. By determining the implementation variants used in the digital circuit and after inserting the recognized implementation variants into the reference description to be compared with the digital circuit substantially greater structural similarity between the reference description and the digital circuit can be achieved, as a result of which the run time for the verification process and the storage requirement needed for this can be drastically reduced. Execution of the verification of the implementation of the verification functions itself can be substantially better, since on the one hand implementation of the multiplication functions can be observed in isolation and on the other hand references about the type and structure of these implementations are known. The process in accordance with the invention in practice still works durably and precisely even if through synthesis optimizations parts of the circuit (in particular also input/outputs of multiplier structures) can no longer be found.

DETAILED DESCRIPTION OF THE INVENTION

The present invention is described below in detail with reference to the accompanying drawing on the basis of a preferred embodiment concerning the computer-aided verification of a digital circuit with multiplier structures and/or multiplication functions, whereby the steps explained below for recognizing the implementation alternatives used for these multiplier structures in the digital circuit and for executing an equivalence test with a correspondingly changed reference description as described are in principle also applicable to other circuit structures, for which several different pre-defined or pre-determined implementation variants are possible.

In the single drawing, a device 1 in accordance with the invention for the computer-aided verification of digital circuits is illustrated. The device 1 as a central component comprises a program-controlled control unit 2, which is controlled by a computer program stored in a program memory 3, which for example has been loaded by means of an interchangeable data medium, for example a disk or CD ROM for executing an automated verification process. The control unit 2 in addition accesses a memory 5, wherein a reference description of a digital circuit, for example an RTL-, VHDL- or Verilog-description, is stored. This reference description serves to develop a corresponding digital circuit, whose implementation for example realized in the form of a VHDL-, Verilog- or gate netlist description etc. is stored in a further memory 6, which the control unit 2 can access. A memory 7 is also provided, wherein as a function of the synthesis tool made available for developing the digital circuit the implementation alternatives, made available by this synthesis tool for (integral) multiplication functions of the digital circuit, are stored. As already described above, each multiplication function or multiplier structure can in principle be implemented in the most varied way and in particular also in different architectures.

As the result of access to the information stored in memories 5-7 the implementation of the digital circuit (for example in the form of a gate netlist) to be verified, the reference description of the digital circuit (for example in the form of an RTL-description) to be compared therewith by means of an equivalence test, the different pre-defined implementation alternatives made available for multiplication functions or multiplier structures (for example dependent on the architectures made available by the respective synthesis tool) and the position/embedding of the multiplier structures in the reference description are therefore known to the control unit 2. By means of this information the control unit 2 can execute the equivalence checking of the implementation of the digital circuit described in detail below. The information described above and stored in the memory devices 5-7 is present anyway in a standard synthesis flow for example. However, the position/embedding as well as the type of the multiplier structures in the implementation of the digital circuit to be verified for example do not have to be known to the control unit 2.

The control unit 2 with the aid of this given information decides which of the pre-defined implementation alternatives for the individual multiplication functions of the reference description are used in the implementation of the digital circuit. For this purpose, the control unit 2 simulates the different implementation alternatives of all multiplication functions in parallel within their embedding in the reference description and compares the simulation result in each case with the corresponding simulation of the implementation of the digital circuit to be verified. In this case, the degree of equivalence with the implementation of the digital circuit is determined for each implementation alternative of every multiplication function of the reference description. This degree of equivalence is defined as the number of all points of equivalence of the respective implementation alternative, whereby a point of equivalence is again an (internal) design point of the respective implementation alternative, which for all simulation patterns made computes the same values as a (random but fixed) design point of the implementation of the digital circuit. The control unit 2 for each multiplication function of the reference description in this way determines that implementation alternative, which possesses the greatest degree of equivalence with the simulation of the implemented digital circuit. The degree of equivalence can be computed in linear time dependent on the size of the circuits to be compared by means of equivalence class refinement.

With this knowledge, the verification task can be substantially simplified. For this purpose, the implementation alternative determined for each multiplication function and/or multiplier structure is inserted by the control unit 2 in the reference description of the digital circuit in place of this multiplication function (for example RTL-multiplication function) and subsequently the equivalence comparison with the implementation of the digital circuit to be verified is executed with the reference description modified in this way. Due to the high structural equivalence between the modified reference description obtained thereby on the one hand, and the implementation of the digital circuit on the other the subsequent equivalence test can be substantially speeded up. In the ideal case with regard to the multiplications complete equivalence exists between the two circuit descriptions, which substantially simplifies the equivalence test. In practice, at least a very high degree of structural equivalence can be achieved.

Finally, the implementation alternatives used in the reference description for the multiplication functions and/or multiplier structures can also be separately verified, that is to say isolated, with specialized processes.

The results of the equivalence test are output via an output unit 4 and thus visualized on a screen, for example.

The parallel simulation of all implementation alternatives of the multiplication function/multiplier functions described above can be technically very simply realized. Thus, it is possible for example to connect corresponding primary inputs of the multiplier structures with one another and lead the corresponding primary outputs so maintaining their function, that is to say without falsifying the multiplication result of each individual multiplier structure, to a common output which can happen by means of a logic OR link for example. In addition, a conventional random pattern simulation can be used for simulating the implementation alternatives as well as the digital circuit description.

A high level of importance for speeding up the synthesis verification, that is to say for comparing an RTL description with the gate netlist synthesized therefrom is: attached to the process described above for recognizing the different implementation alternatives of multiplier structures in the digital circuit description. The run time and the storage requirement of tools for the formal circuit comparison greatly depend on how great the degree of equivalence between the circuits to be compared and/or the corresponding circuit descriptions is. This degree of equivalence can be expressed as the number of pairs of internal design points from the two circuits, which compute matching functions. In the case of the processes described above a very high recognition rate for the realized implementation alternatives of multiplying structures can be achieved. At the same time, this process is characterised in that only few simulations are needed for differentiating between different implementation alternatives and therefore also the extra run time requirement of the process is extremely low.

Experimental results of the process in accordance with the invention have without exception shown to be extremely positive. Thus, for recognizing 21 different multiplier implementations (with varying bit width and also with varying architectures) a run time of only approx. two minutes was needed. For each multiplier structure four implementation alternatives were available for selection. In all cases, the correct implementation alternative was recognized. With the correct implementation alternatives a 50-60% match of the internal design points was achieved, while the wrong implementation alternatives were evaluated by the process with only a 10-20% match. In this case only 1024 simulations (simulation stimuli) were computed. The subsequent verification step (equivalence test) could be substantially speeded up with the aid of this information and concluded after approx. 45 minutes. In the case of the conventional procedure, that is to say without recognition of the implementation alternatives for the multiplier structures with subsequent separate verification, a run time of more than 24 hours was required.

To recapitulate it can therefore be stated that recognition of the implementation alternatives of the multiplier structures used is possible with very high reliability at virtually negligible extra cost and leads to substantial speeding up of the formal verification of digital circuits.

The invention claimed is:

1. A method for providing an alternative reference description for the use in verification of digital circuits by using a computer, wherein in the verification a digital circuit to be verified is compared with a reference description of the digital circuit, in order to recognize errors in the digital circuit using an equivalence test, wherein for at least one specific circuit structure described by a reference description of the digital circuit a plurality of different pre-defined implementation alternatives is known, the method comprising the computer implemented steps of:

(a) determining, for each one of the at least one specific circuit structure first implementation alternative out of the plurality of the different pre-defined implementation alternatives, such that the first implementation alternative has the greatest degree of structural equivalence with the digital circuit to be verified compared to other implementation alternatives out of the plurality of the different pre-defined implementation alternatives and whereby each one of the plurality of the different pre-defined implementation alternatives is simulated respectively, using random pattern simulation, and compared with a corresponding simulation of the digital circuit, in order to determine the first implementation alternative having the highest degree of structural equivalence with the digital circuit, the implementation alternative out of the plurality of the different pre-defined implementation alternatives, which, under the random pattern simulation, has the largest number of equivalent design points with the digital circuit, (b) replacing in the reference description of the digital circuit, the description of the individual circuit structures by the first implementation alternative determined for the respective circuit structure in step (a) having the highest degree of structural equivalence in each case to obtain the alternative reference description, and (c) outputting the alternative reference description for use as a reference description in the verification of the digital circuit, wherein the at least one specific circuit structure, for which in step (a) the first implementation alternative with the highest degree of structural equivalence is determined in each case, are multiplier structures for realizing integral multiplication functions.

2. The method according to claim 1, wherein the reference description is selected from a group comprising RTL-, VHDL- and Verilog-descriptions.

3. The method according to claim 1, wherein an equivalence test is executed by comparing an existing implementation of the digital circuit with the alternative reference description.

4. The method according to claim 1, wherein the plurality of different pre-defined implementation alternatives for the specific circuit structures comprise varying architectures of the specific circuit structures aided by a synthesis device available for the design of the digital circuit.

5. The method according to claim 1, wherein in step (a) for each circuit structure, the different implementation alternatives are simulated at the same time and compared with the simulation of the digital circuit.

6. The method according to claim 5, wherein the different implementation alternatives for each circuit structure are simulated at the same time by inputs of the implementation alternatives being connected with one another and corresponding outputs of the implementation alternatives being led to a common output to maintain the circuit function of the individual implementation alternatives.

7. The method according to claim 6, wherein the outputs of the different pre-defined implementation alternatives are connected by a logic OR link to the common output.

8. The method according to claim 1, wherein for each implementation alternative in step (a), the degree of equivalence with the simulation of the digital circuit is obtained by the number of values output for individual simulation patterns of the reference description with the respective implementation alternative, the alternative values identically output, which are identical to values output by the digital circuit for the corresponding simulation patterns, being determined for the simulation patterns for each implementation alternative and being used as degree of equivalence for the corresponding implementation alternative.

9. The method according to claim 1, wherein determining the first implementation alternatives with the greatest degree of structural equivalence carried out in step (a) is at least partially performed by a method of equivalence class refinement, wherein all internal design points, whose non-match has not yet been proven, are combined in an equivalence class.

10. An apparatus for providing an alternative reference description for the use in verification of digital circuits, with first memory means for storing a description of a digital circuit to be verified, with second memory means for storing a reference description of the digital circuit, and with verification means, which are set up in such a manner that the verification means compare the description of the digital circuit to be verified with the reference description, in order through an equivalence test to recognize errors in the digital circuit, wherein third memory means are provided for storing a plurality of different pre-defined implementation alternatives for at least one specific circuit structure of the digital circuit, whereby the verification means are set up in such a manner that, for each one of the at least one specific circuit structure, the verification means determine a first implementation alternative out of the plurality of different pre-defined implementation alternatives, such that the first implementation alternative has the greatest degree of structural equivalence with the digital circuit to be verified, compared to other implementation alternatives out of the plurality of the different pre-defined implementation alternatives, the verification means are set up in such a manner that, for determining the first implementation alternative out of the plurality of different pre-defined implementation alternatives that has the greatest degree of structural equivalence with the digital circuit in each case, the verification means simulate each one of the plurality of different pre-defined implementation alternatives respectively, using random pattern simulation, and compare the simulations with a corresponding simulation of the digital circuit, to determine the first implementation alternative with the greatest degree of structural equivalence with the digital circuit, which under the random pattern simulation, has the largest number of equivalent design points with the digital circuit, and the verification means are set up in such a manner that the verification means insert the previously determined first implementation alternatives with the greatest degree of structural equivalence, respectively, in the reference description of the digital circuit to obtain the alternative reference description for the individual specific circuit structures and output the alternative reference description for use as a reference description in the verification of the digital circuit, wherein at least one specific circuit structure, for which in step (a) the first implementation alternative with the greatest degree of equivalence is determined in each case, are multiplier structures for realizing integral multiplication functions.

11. The apparatus according to claim 10, wherein, the device is adapted to execute a method for the verification of digital circuits, wherein a digital circuit to be verified is compared with an alternative reference description of the digital circuit, in order, to recognize errors in the digital circuit using an equivalence test, wherein for at least one specific circuit structures described by a reference description of the digital circuit, a plurality of different pre-defined implementation alternatives is known, the method comprising:

(a) determining, for each one of the at least one specific circuit structure first implementation alternative out of the plurality of the different pre-defined implementation alternatives, such that the first implementation alternative has the greatest degree of structural equivalence with the digital circuit to be verified compared to other implementation alternatives out of the plurality of the different pre-defined implementation alternatives, and whereby each one of the plurality of the different pre-defined implementation alternatives is simulated respectively, using random pattern simulation, and compared with a corresponding simulation of the digital circuit, in order to determine the first implementation alternative having the greatest degree of structural equivalence with the digital circuit, the implementation alternative out of the plurality of the different pre-defined implementation alternatives, which, under the random pattern simulation, has the largest number of equivalent design points with the digital circuit, (b) replacing in the reference description of the digital circuit, the description of the individual circuit structures by the first implementation alternative determined for the respective circuit structure in step (a) having the greatest degree of structural equivalence in each case to obtain the alternative reference description, and (c) outputting the alternative reference description for use as a reference description in the verification of the digital circuit, wherein at least one specific circuit structure, for which in step (a) the first implementation alternative with the greatest degree of equivalence is determined in each case, are multiplier structures for realizing integral multiplication functions.

12. A computer-program product with a program-code stored on a data medium, for executing a method for providing an alternative reference description for the use in verification of digital circuits, wherein in the verification a digital circuit to be verified is compared with a reference description of the digital circuit, in order, to recognize errors in the digital circuit using an equivalence test, wherein for at least one specific circuit structure described by a reference description of the digital circuit a plurality of different pre-defined implementation alternatives is known, the method comprises when executed on a computer:

(a) determining, for each one of the at least one specific circuit structure first implementation alternative out of the plurality of the different pre-defined implementation alternatives, such that the first implementation alternative has the greatest degree of structural equivalence with the digital circuit to be verified compared to other implementation alternatives out of the plurality of the different pre-defined implementation alternatives and whereby each one of the plurality of the different pre-defined implementation alternatives is simulated respectively, using random pattern simulation, and compared with a corresponding simulation of the digital circuit, in order to determine the first implementation alternative having the greatest degree of structural equivalence with the digital circuit, the implementation alternative of the plurality of the different pre-defined implementation alternatives, which, under the random pattern simulation, has the largest number of equivalent design points with the digital circuit, (b) replacing in the reference description of the digital circuit, the description of the individual circuit structures by the first implementation alternative determined for the respective circuit structure in step (a) having the greatest degree of structural equivalence in each case to obtain the alternative reference description, and (c) outputting the alternative reference description for use as a reference description in the verification of the digital circuit, wherein at least one specific circuit structure, for which in step (a) the first implementation alternative with the greatest degree of equivalence is determined in each case, are multiplier structures for realizing integral multiplication functions.

13. A digital storage medium with electronically readable control signals, which can cooperate with a computer system, executing a method for providing an alternative reference description for the use in verification of digital circuits, wherein in the verification a digital circuit to be verified is compared with a reference description of the digital circuit, in order, to recognize errors in the digital circuit using an equivalence test, wherein for at least one specific circuit structure described by a reference description of the digital circuit a plurality of different pre-defined implementation alternatives is known, the method comprising:

(a) determining, for each one of the at least one specific circuit structure first implementation alternative out of the plurality of the different pre-defined implementation alternatives, such that the first implementation alternative has the greatest degree of structural equivalence with the digital circuit to be verified compared to other implementation alternatives out of the plurality of the different pre-defined implementation alternatives, and whereby each one of the plurality of the different pre-defined implementation alternatives is simulated respectively, using random pattern simulation, and compared with a corresponding simulation of the digital circuit, in order to determine the first implementation alternative having the greatest degree of structural equivalence with the digital circuit, the implementation alternative out of the plurality of different pre-defined implementation alternatives, which, under the random pattern simulation, has the largest number of equivalent design points with the digital circuit, (b) replacing in the reference description of the digital circuit, the description of the individual circuit structures by the first implementation alternative determined for the respective circuit structure in step (a) having the greatest degree of structural equivalence in each case to obtain the alternative reference description, and (c) outputting the alternative reference description for use as a reference description in the verification of the digital circuit, wherein at least one specific circuit structure, for which in step (a) the first implementation alternative with the greatest degree of equivalence is determined in each case, are multiplier structures for realizing integral multiplication functions.

* * * * *